US007026641B2

(12) United States Patent
Mohseni et al.

(10) Patent No.: US 7,026,641 B2
(45) Date of Patent: Apr. 11, 2006

(54) ELECTRICALLY TUNABLE QUANTUM DOTS AND METHODS FOR MAKING AND USING SAME

(75) Inventors: Hooman Mohseni, Princeton, NJ (US); Winston Kong Chan, Princeton, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 10/642,095

(22) Filed: Aug. 15, 2003

(65) Prior Publication Data

US 2004/0256612 A1 Dec. 23, 2004

Related U.S. Application Data

(60) Provisional application No. 60/403,927, filed on Aug. 15, 2002.

(51) Int. Cl.
*H01L 29/06* (2006.01)
(52) U.S. Cl. .............................. 257/14; 257/15; 257/20; 257/24
(58) Field of Classification Search .................. 257/15, 257/17, 14, 20, 24; 438/962
See application file for complete search history.

(56) References Cited

OTHER PUBLICATIONS

Timsit. et al., "Structure Of The A1/A12O3 Interface", Appl. Phys. Lett. 46, p. 830 (1985).

Hoessein-Babaei et al., "Electrophoretically Deposited Zinc Oxide Thick Film Gas Sensor", Elec. Letters 36, No. 21, (2000).

Lewis, et al.,, "Measurements Of Geometric Enhancement Factors For Silicon Nanopillar Cathodes Using A Scanning Tunneling Microscope", Appl. Phys. Lett. 79, p. 1348 (2001).

T. Van Dlllen, et al., "Energy-Dependent Anisotropic Deformation Of Colloidal Silica Particles Under MeV Au Irradiation", Appl. Phys. Lett. 78, p. 910 (2000).

Fang, et al., "Fabrication of Quasi-Zero-Dimensional Submicron Dot Array And Capacitance Spectroscopy In A GaAs/AlGaAs Heterostructure", Appl. Phys. Lett. 55, p. 1433 (1989).

Kim, et al., "Growth and Characterization of InGaAs/InGaP Quantum Dots For Midinfrared Photoconductive Detector", Appl. Phys., Lett. 73, p. 963 (1998).

Phillips, et al., "Far-Infrared Photoconductivity In Self-Organized InAs Quantum Dots", Appl. Phys. Lett. 72, p. 2020 (1998).

(Continued)

*Primary Examiner*—Sara Crane
(74) *Attorney, Agent, or Firm*—Lowenstein Sandler

(57) ABSTRACT

A method of fabricating a tunable quantum dot apparatus, comprising: forming multi-quantum wells sandwiched substantially between at least two barrier layers; spin coating a non-continuous mask onto at least one of said barrier layers; forming a gate material onto the mask, wherein the non-continuity of the mask substantially prevents formation of a continuous gate material layer; lifting off at least a portion of the gate material; self isolating the gate material; and, forming a top contact onto at least a portion of said barrier layers

14 Claims, 10 Drawing Sheets

NO-LATERAL CONFINEMENT

WITH LATERAL CONFINEMENT

OTHER PUBLICATIONS

Pan, et al., "Normal-Incidence Intersubband (In, Ga) As/GaAs Quantum Dot Infrared Photodetectors", Appl. Phys. Lett. 73, p. 1937 (1998).

Lee, et al., "Bound-To-Continuum Intersubband Photoconductivity Of Self-Assembled InAs Quantum Dots In Modulatin-Doped Heterostructures", Appl. Phys. Lett. 75, p. 1428 (1999).

Belyaev, et al., "Positively Charged Defects Associated With Self-Assembled Quantum Dot Formation", Appl. Phys. Lett. 76, p. 3570 (2000).

Gotoh, et al., "Spin Relaxation Of Excitons In Zero-Dimensional InGaAs Quantum Disks", Appl. Phys. Lett. 72, p. 1341 (1998).

Wang, et al., "Radiative Recombination In GaAs-A1xGa1-x as Quantum Dots", Appl. Phys. Lett. 61, p. 946 (1992).

Benisty, et al., "Intrinsic Mechanism For The Poor Luminescence Properties Of Quantum Box Systems", Phys. Rev. B 44, p. 10945 (1991).

B. Levine, "Quantum-Well Infrared Photodtectors," J. Appl. Phys. 74, p. R1 (1993).

Kash, et al., "Optical Spectroscopy Of Ultrasmall Structures Etched From Quantum Wells", Appl. Phy s. Lett. 49, p. 1043 (1986).

Michel, et al., "Length Quantization In $In_{0.13}Ga_{0.87}As/$ GaAs Quanatum Boxes With Rectangular Cross Section", Appl. Phys. Lett. 70, p. 393 (1997).

Wu, et al., "Effect Of Size NonUniformity On the Absorption Spectrum Of A Semiconductor Quantum Dot System", Appl. Phys. Lett. 51, p. 710 (1987).

Nagamune, et al., "Observation Of A Single Photoluminescence Peak From A Single Quantum Dot", Appl. Phys. Lett. 67, p. 27 (1995).

Kiraz, et al., "Cavity-Quantum Electrodynamics Using A Single InAs Quantum Dot In A Microdisk Structure", Appl. Phys. Lett. 78, p. 3932 (2001).

Marinelli, et al., "Tunable Fabry-Perot Etalon-Based Long-Wavelength Infrared Imaging Spectroradiometer", Appl. Optics 38, pp. 2594-2604 (1999).

Hawkins, et al., "Overview Of The Multi-Spectral Imager On The Near Spacecraft", Acta Astronautica, 39, pp. 265-271 (1996).

Bhargava et al., "Theory And Application Of Gain Ranging To Fourier Transform Infrared S pectroscopic Imaging", Appl. Spectroscopy 55, pp. 1580-1589 (2001).

NO LATERAL CONFINEMENT

FIG. 1A

WITH LATERAL CONFINEMENT

FIG. 1B

LOW LATERAL CONFINEMENT

HIGH LATERAL CONFINEMENT

FIG. 3

FIG. 2A ENERGY MOMENTUM

FIG. 2B DENSITY OF STATES

FIG. 2C OPTICAL ABSORPTION

REAL-SPACE    MOMENTUM-SPACE

FIG. 6

702 1-SPIN LATEX SPHERE SUSPENSION
704 2-GATE METAL EVAPORATION
706 3-METAL LIFTOFF
708 4-METAL ANODIZATION
710 5-TOP CONTACT EVAPORATION

FIG. 7

3-METAL LIFTOFF

2-GATE METAL EVAPORATION

5-TOP CONTACT EVAPORATION

1-SPIN LATEX SPHERE SUSPENSION

4-METAL ANODIZATION

ELECTRICALLY TUNABLE QUANTUM DOTS AND METHODS FOR MAKING AND USING SAME

CROSS REFERENCE TO RELATED APPLICATIONS

This Application claims the benefit of priority to now abandoned U.S. Provisional Patent Application Ser. No. 60/403,927, entitled "Fabrication of Electrically Tunable Quantum Dots", filed Aug. 15, 2002, the entire disclosure of which is hereby incorporated by reference as if being set forth herein in its entirety.

FIELD OF THE INVENTION

The present invention is directed generally to a method and apparatus relating to quantum dots, and, more particularly, to a method and apparatus for a self-aligned, self-isolating realization of quantum dots by which three-dimensional quantum confinement can be electrically tuned.

DESCRIPTION OF THE BACKGROUND OF THE INVENTION

A system, such as an infrared system, may realize wavelength selectivity by, for example, filtering selected photons, or, for example, by selective detection of photons having a particular wavelength. Further, a system, such as an infrared system, may realize wavelength tunability by tuning a filter that filters selected ones of the photons. Such selectivity and/or tunability may, in part, provide electrically tunable infrared detectors. Electrically tunable infrared detectors are highly desirable for advanced sensing and imaging applications and systems.

Tunable photon filters are a simple and common method for the realization of tunable infrared focal plane arrays. Discrete and continuous tuning have been realized by placement of filter wheels, tunable Fabry-Perot filters, or FTIR based filters in front of the focal plane arrays. However, wavelength tunability at a "pixel level" cannot be achieved by these methods.

A pixel-level integration of tunable filter elements and detector elements is highly desirable. Such integration is difficult to develop for mass production, and has several physical limitations. Such difficulties are due, in part, to the absence of an effective multi-level heterogeneous integration method. More fundamentally, such difficulties are due, in part, to physical separation of the filter and detector, which makes the broadband detector more vulnerable to interference, such as pixel-to-pixel crosstalk, wavelength suppression, and the like. This vulnerability becomes more significant as electrical interconnections and/or electronic components are placed between the elements of the filter and the elements of the detector. Additionally, thermal, mechanical, and electrical incompatibilities between the material of the filter and the material of the detector may limit the operation of the device to undesirably narrow temperature, acceleration, and voltage ranges.

These issues may, in part, be eliminated or alleviated if filtering and sensing were unified. For example, selective detection integrates the filter and the sensor elements. An absorption mechanism for selective detection may be provided by resonance between photons and electron states, which provides an avenue for selective infrared detection because only photons with energies equal to the difference of the energy levels can excite electrons. The selectivity of this absorption mechanism is illustrated by the narrow absorption lines in gases with $\Delta\lambda/\lambda<0.1\%$.

In semiconductor material, the interaction between periodically spaced atoms provides a continuous range of allowed energy states, and this continuous range is termed an "energy band." Photon absorption between two electron energy bands in a semiconductor material is not highly selective. Commonly used devices based on inter-sub-band transition include quantum well infrared photodetectors (QWIP) with a natural bandwidth $\Delta\lambda/\lambda$ of only 10–20%. Unfortunately, this bandwidth is not narrow enough for many applications, and it cannot be easily tuned.

A principal absorption broadening mechanism in a quantum well inter-sub-band transition is energy dispersion in the plane of quantum wells. Such energy-momentum dispersion is a direct result of atomic periodicity generating a periodic potential in the plane of the quantum wells.

BRIEF SUMMARY OF THE INVENTION

A method of fabricating a tunable quantum dot apparatus, including: forming multi-quantum wells sandwiched substantially between at least two structural layers; spin coating a non-continuous mask onto at least one of the structural layers; forming a gate material onto the mask, wherein the non-continuity of the mask substantially prevents formation of a continuous gate material layer; lifting off at least a portion of the gate material; self isolating the gate material; and, forming a top contact onto at least a portion of the structural layers.

An aspect of the present invention includes a tunable structure and system including a quantum dot or quantum wire. The tunable structure and system may include a first layer of a plurality of AlGaAs/GaAs multi-quantum wells, a plurality of AlGaAs barriers providing barriers in the first layer, at least two GaAs epitaxial layers sandwiching the first layer, wherein each of the first layer and the at least two GaAs epitaxial layers are n-doped.

The method may include the steps of forming at least two epitaxial grown structures, wherein the epitaxial grown structures include at least two GaAs layers sandwiching a plurality of AlGaAs/GaAs multi-quantum wells, spin coating a mask onto the epitaxial grown structure, wherein the mask includes one selected from micro or nano spheres, or other shapes, evaporating a gate metal layer onto the mask, wherein the spherical shape of the mask substantially prevents formation of a continuous gate metal layer, lifting off at least a portion of the gate metal by dissolving the spheres, self isolating the gate metal, and evaporating a top contact onto one of the epitaxial grown layers.

BRIEF DESCRIPTION OF THE SEVERAL VIEWS OF THE DRAWINGS

For the present invention to be clearly understood and readily practiced, the present invention will be described in conjunction with the following figures, wherein like reference numerals represent like elements, and wherein.

DETAILED DESCRIPTION OF THE PREFERRED EMBODIMENTS

It is to be understood that the figures and descriptions of the present invention have been simplified to illustrate elements that are relevant for a clear understanding of the present invention, while eliminating, for purposes of clarity, many other elements found in a tunable detector apparatus, system, and method. Those of ordinary skill in the art will recognize that other elements are desirable and/or required in order to implement the present invention. However, because such elements are well known in the art, and because they do not facilitate a better understanding of the present invention, a discussion of such elements is not provided herein.

According to an aspect of the present invention a method and apparatus to induce a lateral electric field on a conventional quantum well structure, which lateral field results in a lateral energy confinement that breaks the in-plane periodic potential, and thereby collapses the energy "bands" into energy "states" may be provided.

That is, the present invention induces a lateral electric field on a conventional quantum well structure, which lateral field results in a lateral energy confinement that breaks the in-plane periodic potential, and thereby collapses the energy "bands" into energy "states," and it provides a method and apparatus that combines the one-dimensional vertical confinement of the quantum well with the two-dimensional lateral confinement to provide a three-dimensional quantum confinement, or "quantum dot".

Figure 1A:
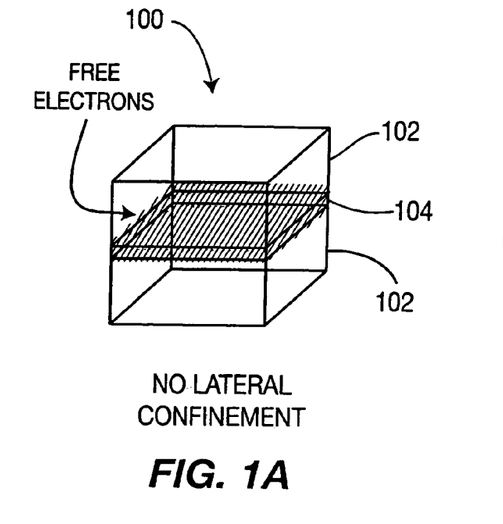
FIG. 1 is a schematic diagram illustrating electron densities in a single quantum well structure without and with lateral confinement.
Figure 1B:
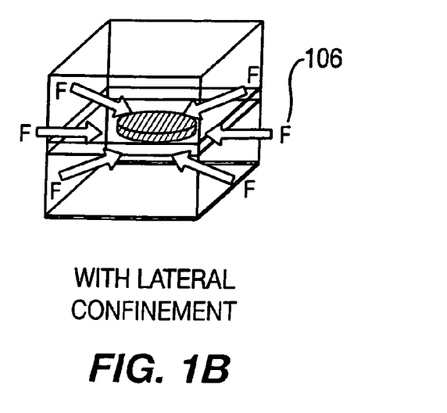

FIGS. 1A and 1B show schematic diagrams illustrating electron densities in a single quantum well structure without (1A) and with (1B) lateral confinement. As illustrated, a lateral electric field 106 generated in a conventional quantum well structure may result in a lateral energy confinement that breaks the in-plane periodic potential, and thereby collapses energy "bands" into energy "states". A quantum well structure 100 in accordance with the present invention may include well barriers 102, at least one well 104, and may, in a lateral confinement embodiment, induce one or more lateral electric fields 106.

Figure 2A:
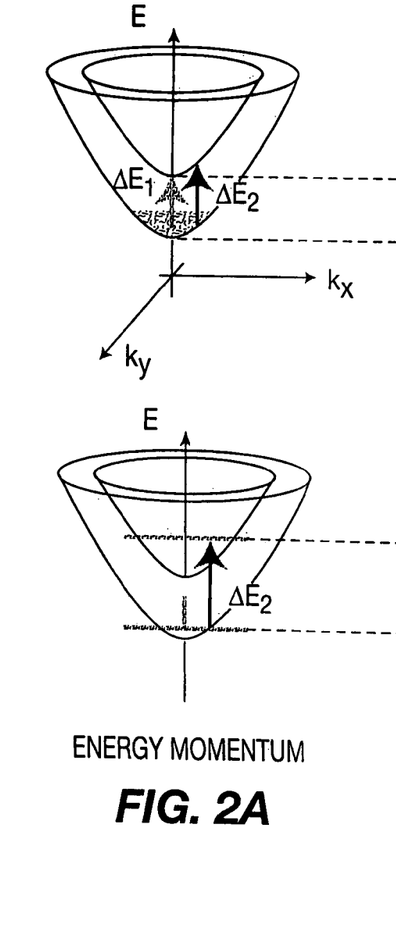
FIG. 2 is a series of graphical diagrams comparing a conventional quantum well with a laterally confined quantum well.

FIG. 2 shows a series of graphical diagrams comparing a conventional quantum well with a laterally confined quantum well. FIG. 2A is a graphical diagram comparing a conventional quantum well with a laterally confined quantum well, in the energy-momentum space. The elimination of periodic potential structures in the quantum well via a lateral confinement prevents the formation of energy bands. More specifically, the prevention of the formation of energy bands significantly affects the density of states. The density of states in such an embodiment changes from a step-shape to a series of delta functions as follows:

Equation 1: $$g^{1D}(E) = \frac{m^*}{\pi \hbar^2} \sum_n \theta(E - E_n)$$

density of states in 1D confinement; and

Equation 2: $$g^{3D}(E) = 2 \sum_{m,n,l} \delta(E - E_{m,n,l})$$

density of states in 3D confinement.

In Equations 1 and 2, m * is the electron effective mass, m, n, and l are the energy indices, θ is the heaviside step function, and δ is the Dirac delta function.

With respect to Equations 1 and 2, the overlap of the Fermi distribution and the density of states govern the distribution of electrons with energy E. Therefore, the change of the density of states from step functions to delta functions reshapes the energy distribution of the electrons into an ultra narrow energy band.

Figure 2B:
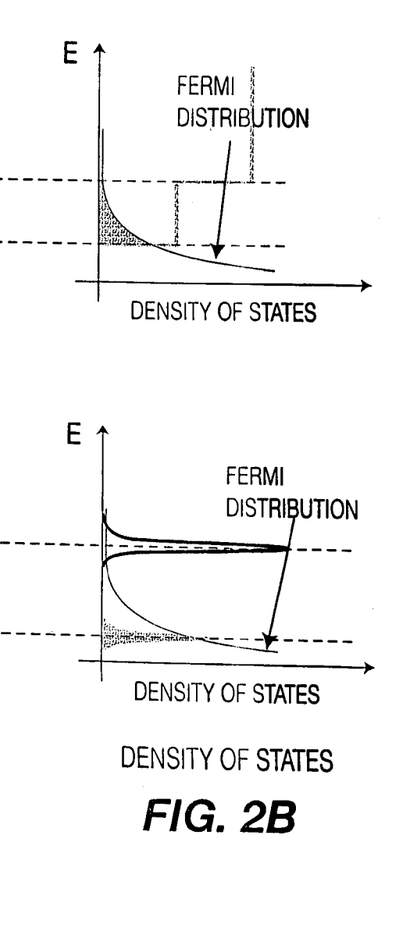
Figure 2C:
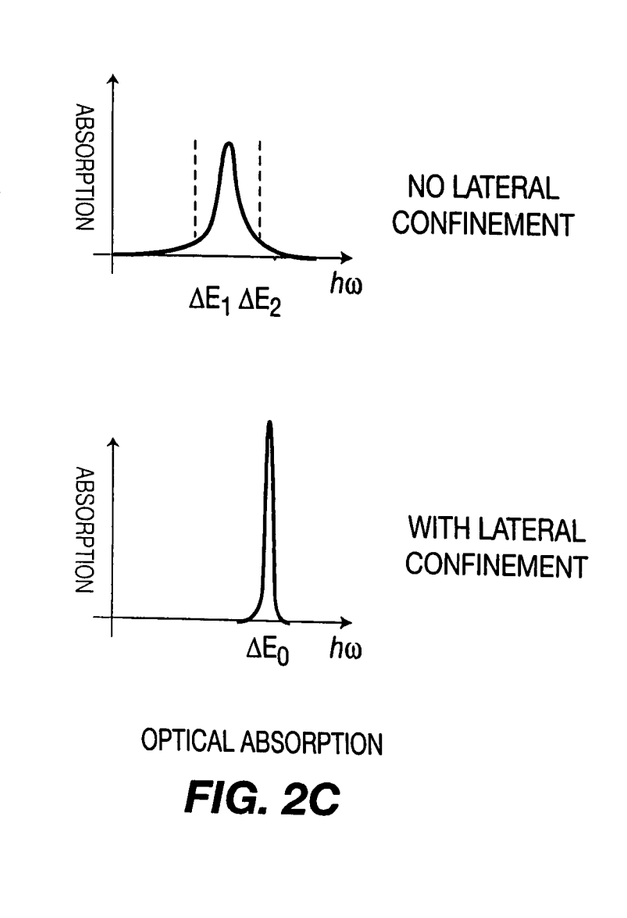

FIG. 2B is a graphical diagram comparing the electron distribution of a quantum well without lateral confinement, and a quantum well with lateral confinement. The electron distribution resultant from the lateral confinement leads to the absorption of photons with an ultra narrow wavelength range, as illustrated in FIG. 2C. This narrow spectral absorption and emission characteristic may be demonstrable from a single quantum dot.

In practical application, and by way of non-limiting example only, a device may include on the order of ~$10^{10}$ dots. Further, inhomogeneous broadening, in accordance with size non-uniformity, rather than homogeneous broadening, may determine the absorption linewidth. The relative absorption linewidth of a system of quantum dots with a Gaussian distribution and a standard deviation of ξ can be calculated as:

Equation 3: $$W = 4 \xi n^2 \left( \frac{\pi^2 \hbar^2}{2 \mu a_0^2} \right) = 4 \xi E_n.$$

In Equation 3, n is the index of the energy level $E_n$, $a_0$ is the size of the quantum dot, and μ is the electron effective mass. The linewidth in this example is directly proportional to the standard deviation of the size distribution.

Lateral uniformity, such as uniformity resulting from the use of latex spheres with a 2.5% size distribution that are commercially available, in conjunction with vertical uniformity of the epitaxial interfaces, may ensure an insubstantial inhomogeneous broadening. The maximum energy shift to cover the 8–12 µm band, for example, is about $E_0$=52 meV. Assuming $\xi$=2.5% for the standard deviation of the lateral size, the linewidth of the detector due to the lateral inhomogeneous broadening is thus about $\Delta\lambda\sim$0.4 µm.

Additionally, because the final lateral dimension of the quantum dots may be directly determined by the masking particle size, the absorption linewidth of the detector may be increased by increasing the size distribution of the masking particles, as discussed herein.

Figure 3:
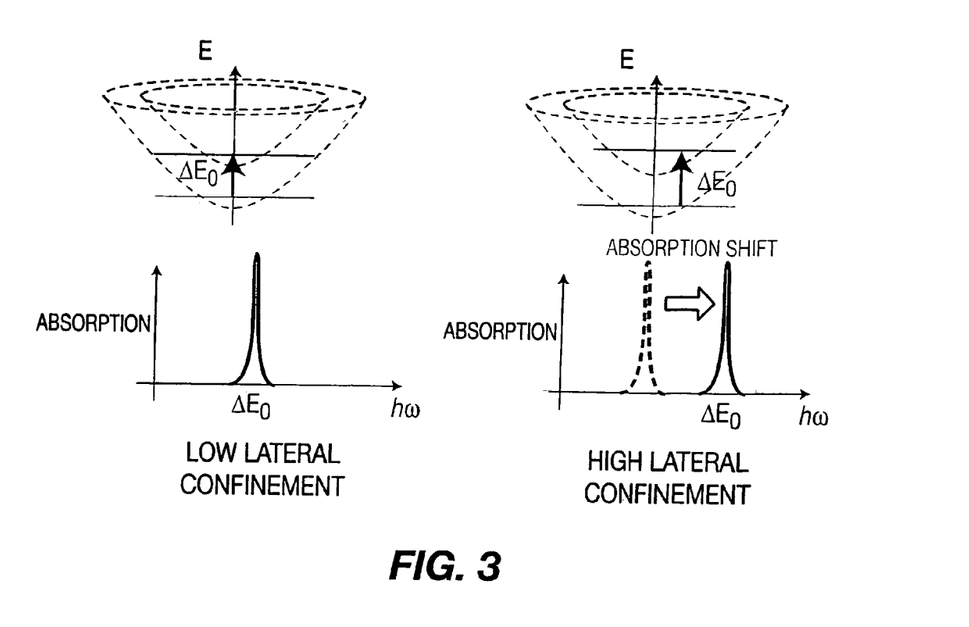
FIG. 3 is a graphical diagram illustrating that, with lateral quantum confinement in a quantum well, allowed energy states shift toward higher energy values.

FIG. 3 is a graphical diagram illustrating that, with lateral quantum confinement in a quantum well, allowed energy states shift toward higher energy values. Unlike lateral quantum confinement based on material wet or dry etching, lateral quantum confinement that is field induced, such as that in the present invention, is more easily tunable. More specifically, the higher the lateral confinement potential, the higher the energy shift. This shift is similar to the absorption blue shift in a quantum well that occurs as a barrier's height is increased. Further, in contrast to the quantum confined Stark effect, the energy shift in the present invention is substantial, due, in part, to the changing, rather than the perturbation, of the barrier potential.

Figure 4:
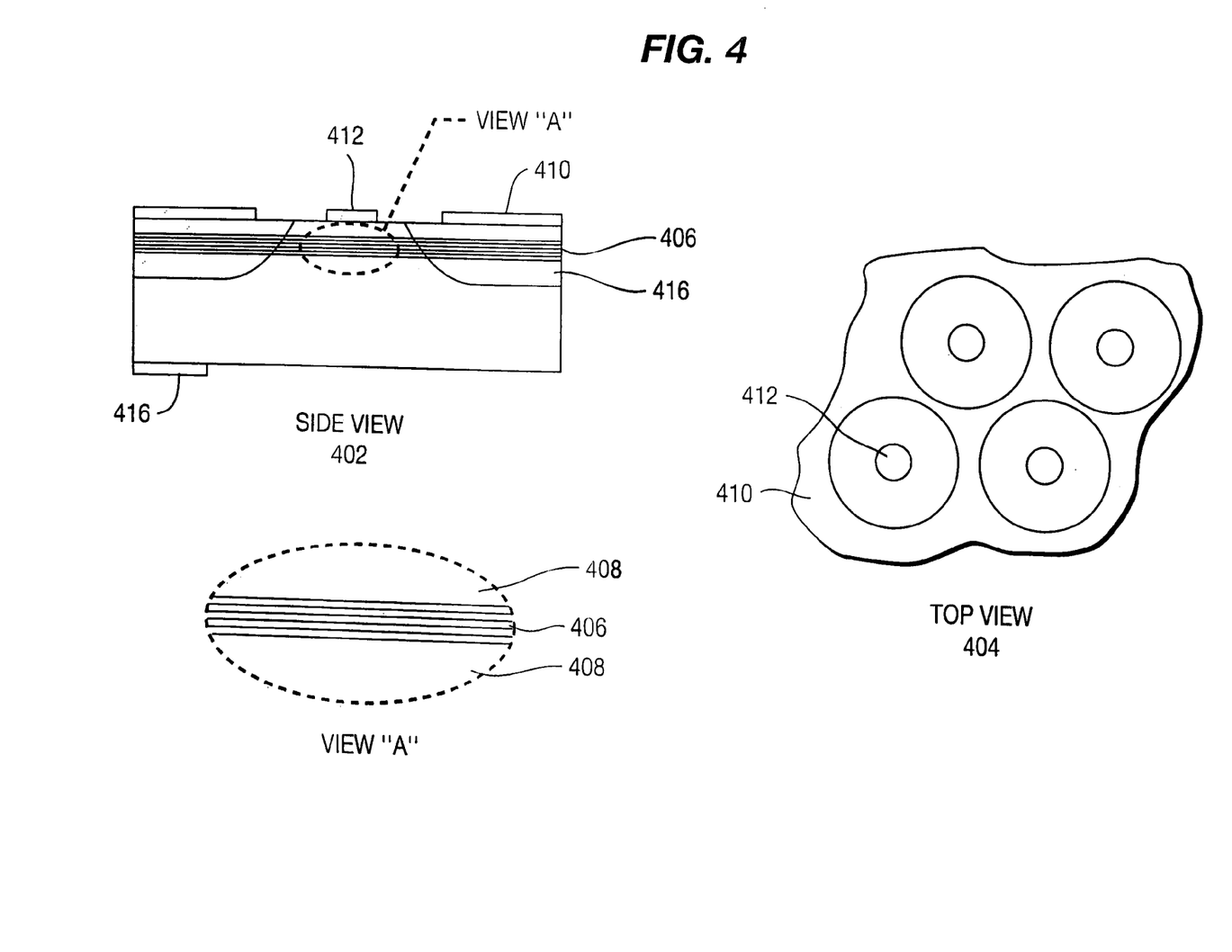
FIG. 4 is a schematic diagram illustrating the side and top views of a structure in accordance with an aspect of the present invention.

FIG. 4 is a schematic diagram illustrating side 402 and top 404 views of a structure in accordance with an aspect of the present invention. The structure may include a layer of AlGaAs/GaAs multi-quantum wells (MQW) 406 between GaAs structural or epitaxial layers 408. In a manner similar to a QWIP structure, all of the layers of the structure of the present invention may be n-doped, except for the AlGaAs barriers. Similarly, all layers except the barriers may be p-doped. Alternatively, any other material system suitable for forming similar quantum wells can be used in a similar fashion, such as layers of semiconductors (III-V, II-VI or IV-IV, by way of non-limiting example only), semi-insulators, insulators or even metals. The gate contact 410 of the structure may be a Schottky contact, while top 412 and back 414 contacts may be ohmic. The Schottky gate contact may provide a donut-shape depleted layer 416 in the semiconductor surrounding the top contact layer.

Figure 5:
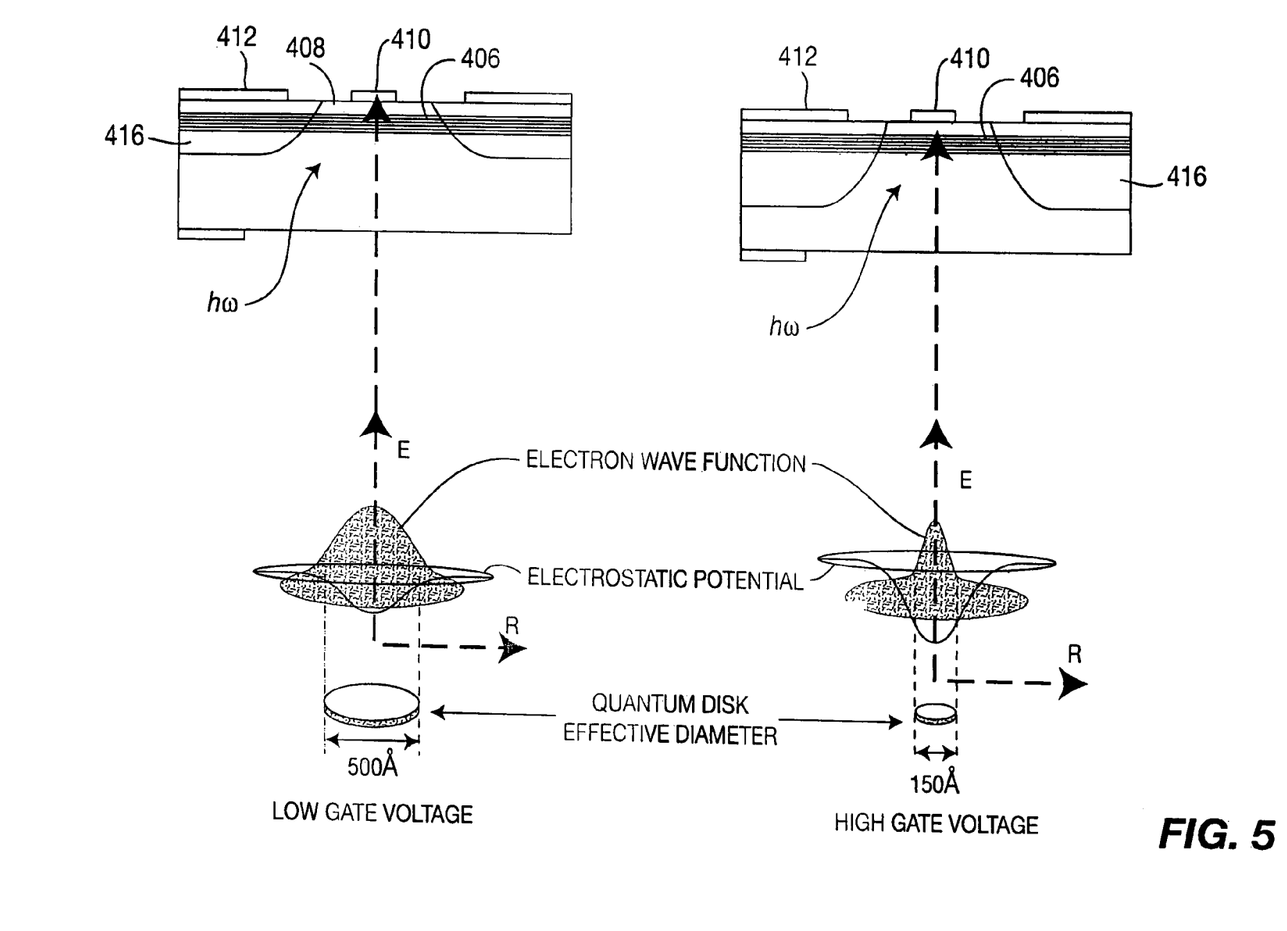
FIG. 5 is a schematic diagram and graphical diagram of the device of FIG. 4 illustrating that, as the gate voltage becomes more negative, the dimensions of the depleted layer increase, and hence the lateral electrostatic potential inside the multi-quantum well increases.

FIG. 5 is a schematic diagram and graphical diagram of the device of FIG. 4 illustrating that, as the gate voltage becomes more negative, the dimensions of the depleted layer increase, and hence the lateral electrostatic potential inside the multi-quantum well increases. The increased lateral potential forces the electron wave-function to accumulate under the top contact. Thus, the effective diameter of the quantum dot is decreased, and hence the electron energy level is increased. Numerical simulation of such a device shows that the electron energy shift of the device is a sensitive function of the gate voltage, and that a detector can be tuned over the entire 8–12 µm waveband by the application of a small voltage.

In the absence of the lateral field, the device described hereinabove resembles a quantum well infrared photodetector, and therefore the gain of the device is the ratio of the carrier recapture lifetime to the transit time:

$$\text{Equation 4:} \quad g = \frac{\tau_{recapture}}{\tau_{transit}}.$$

The maximum gain illustrated in Equation 4 is physically limited, since the minimum transit time is limited by the electron saturation velocity, and the maximum recapture lifetime is limited by the LO phonon scattering rate.

Figure 6:
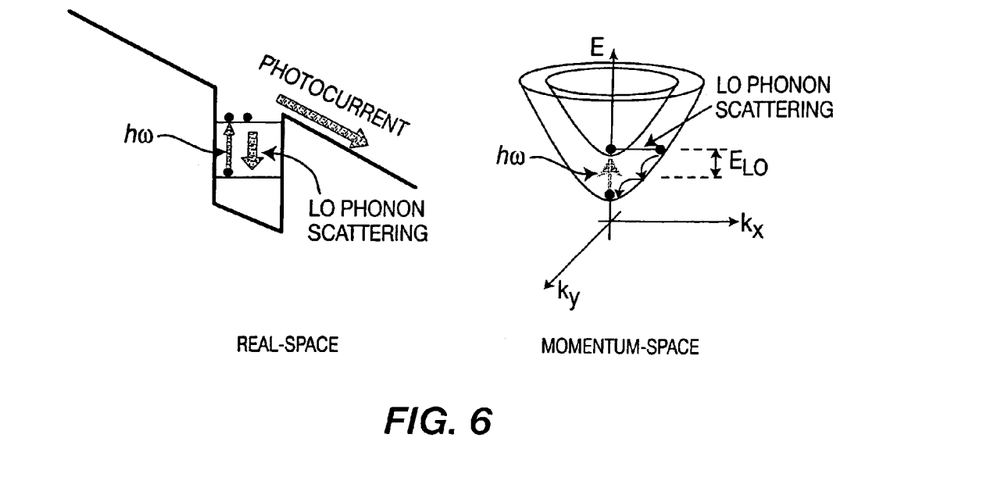
FIG. 6 is a schematic diagram and graphical diagram illustrating the LO phonon scattering process in the energy-position and energy-momentum space.

FIG. 6 is a schematic diagram and graphical diagram illustrating the LO phonon scattering process in the energy-position and energy-momentum space. This process competes with the detection mechanism, namely the optical excitation of the electrons from the lower to the upper sub-band. Therefore, not all of the absorbed photons can generate free, measurable electrons, and some will be scattered back to the lower sub-band. Further, the LO phonon scattering rate between two sub-bands is very high, since the phonon interactions are possible in a large momentum range. In fact, the electron-phonon scattering lifetime may be in the picoseconds range.

However, once lateral quantum confinement is applied to the device, the energy-momentum dispersion is eliminated, and the phonon scattering rate decreases by many orders of magnitude. This process, known as the "phonon bottleneck," has been theoretically and experimentally demonstrated. Other experimental data show that the dispersion-less energy levels in a quantum dot structure can enhance the spin lifetime of the electrons by more than one order of magnitude. A direct consequence of the reduction of the phonon scattering rate by orders of magnitude is the enhancement of the internal gain of Equation 4 by orders of magnitude in an ideal quantum dot based inter-sub-band photoconductor.

The formation of the quantum dots can increase other radiative and non-radiative recombination mechanisms due to the imperfections of the processing and growth. In fact, methods for the formation of dense arrays of quantum dots based on E-beam lithography and subsequent etching, or on self-assembly are commonly used. However, etching can produce significant surface state (wet or dry etching), and surface and bulk crystal damage (mainly dry etching). Also, the formation of self-assembled quantum dots is typically based on strain-induced three-dimensional island formation, which can easily lead to a high density of dislocations. Consequently, experimental data show only a marginal gain enhancement in the quantum dot based inter-sub-band detectors compared to quantum well inter-sub-band detectors.

A device in accordance with the present invention provides strain-free materials growth with no exposed interfaces for surface recombination.

Consequently, a significantly improved gain enhancement may be expected through the use of a device in accordance with the present invention.

In quantum wells, normal incidence absorption is forbidden due to the quantum selection rule in an inter-sub-band transition. The forbidding of normal incidence absorption leads to significant difficulties in the operation of QWIP FPAs, since the only possible direction of the incidence to a two-dimensional array is normal. In practice, different methods have been used to generate parallel components from the normal incident light, such as the introduction of surface gratings. These methods however, have a poor efficiency, which directly affects the overall quantum efficiency of the array. However, this forbidding breaks down in a quantum dot. Normal incidence absorption has been reported to occur from self-assembled inter-sub-band quantum dots.

The fabrication of a device in accordance with the present invention may include the fabrication of closely packed top contacts surrounded by gate contacts with dimensions approaching 0.1 µm. Further, the top contacts of such a device should be connected together without formation of a short circuit to the fully connected gate contacts. A simple short circuit in one quantum dot can lead, for example, to a malfunction pixel. There are about quarter of a million quantum dots per pixel, and the formation of short circuits can substantially reduce the yield of conventional fabrication methods to almost zero.

A self-aligned, self-isolating process, in accordance with the present invention, is capable of mass production of tunable quantum dot focal plane arrays. According to an aspect of the present invention, the process may include self-alignment that eliminates the difficulties in alignment for deep submicron processes, and self-isolation that substantially eliminates the development of short circuits.

Figure 7:
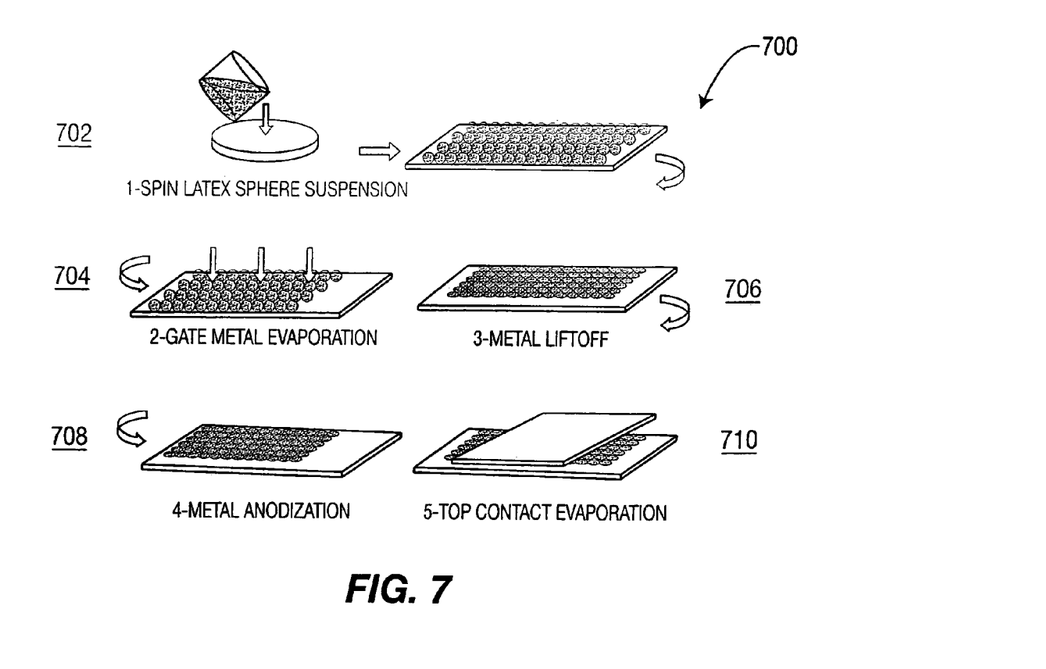
FIG. 7 is a process flow diagram illustrating steps according to an aspect of the present invention.
Figure 8:
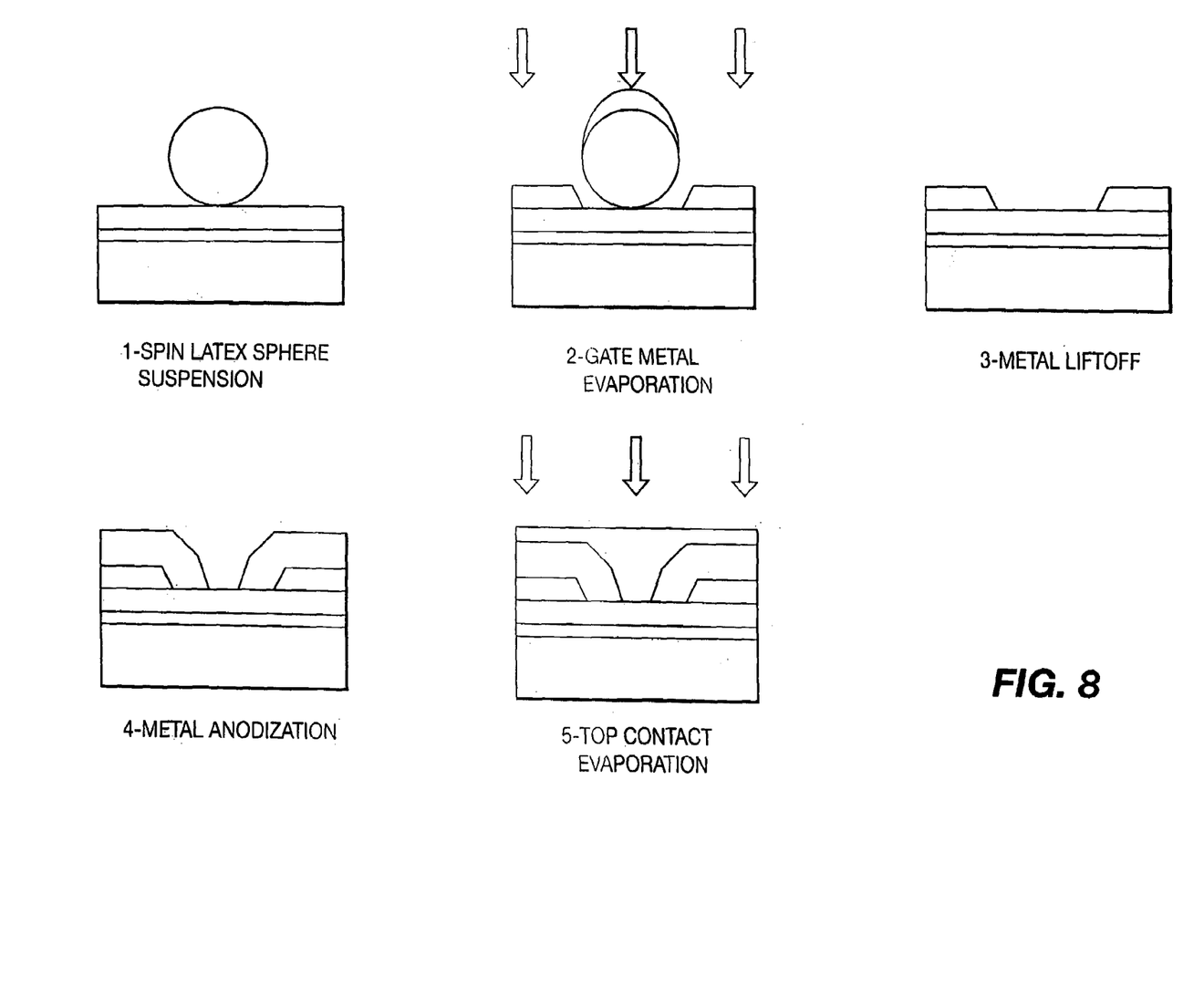
FIG. 8 is a process flow diagram illustrating steps of FIG. 7.

FIGS. 7 and 8 are process flow diagrams illustrating a proposed process 700 of the present invention. As a first step 702 in this process, the mask may be spun. More specifically, after surface preparation, an epitaxial grown structure may be spin coated with a suspension of latex or silica ($SiO_2$) spheres. Alternatively, other micro and nanometer size particles can be used, such as, by way of non-limiting example only, metal nano-spheres, carbon C-60, or carbon nano-tubes. This method may provide a uniform distribution of such particles on the surface.

In a second step 704, a gate metal may be evaporated on the sample. The spherical shape of the masking particles substantially prevents the formation of a continues metal layer, and hence the spheres act as a liftoff mask. Metal liftoff 706 may be achieved by dissolving the latex spheres in an organic base and silica in buffered HF solvents. Alternatively, metal mask material may be dissolved using acids, and carbon based masks may be lifted off using an oxygen plasma.

In a fourth step 708, the gate metal may be self-isolated. The gate metal may be, for example, aluminum, which makes a good Schottky contact to the n-type GaAs top structural layer. Further, aluminum may be anodized 708 to form a uniform and resistive aluminum oxide (alumina) layer. Detailed studies of anodized aluminum oxide show that the oxide has a conformal nature, even in the submicron levels. Thus, the oxide may grow uniformly around the edge of the gate contact and leave a uniform opening in the middle. Additionally, the metal-oxide interface is atomically smooth (similar to $Si/SiO_2$), which ensures a high mechanical stability. Further, the anodization process is self-limiting, meaning that any crack in the oxide provides a conductive path, which path leads to a further localized oxidation or "healing." The thickness of the oxide is a function of anodization voltage, and can be controlled precisely. It should be noted that self-isolation is not limited to aluminum, and can be extended to other metals using electrophoretic deposition (EPD) of oxides, for example.

In a next step 710, the top contact may be evaporated. The top metal contact may be deposited on the surface with metal evaporation. The top contact metal forms an ohmic contact to the top GaAs structural layer.

In addition to the steps detailed hereinabove, those skilled in the pertinent arts will appreciate that there may be additional photolithographic steps to pattern the pixel level, the gate contact, and the top contact layers, or bottom contacts, which additional steps are not detailed hereinabove. These additional steps may be performed after gate liftoff and top contact evaporation, and may form the desired shape of the pixel and the bonding pads, or other characteristics.

The tuning mechanism of the present invention may be assessed through a numerical simulation. A simulation software package, such as PICS3D™ (CrossLight, Inc.), may be employed to calculate electrical potential within the semiconductor for subsequent input to a Schrodinger Equation solver. The simulation, such as the PICS3D™ simulation, may take into account a large variety of physics within the semiconductor device, such as Poisson's equation with boundary conditions, carrier transport, dielectric properties, quantum well properties, heterojunction discontinuities, and the like. Such simulations may verify the design principles of the present invention.

Figure 9A:
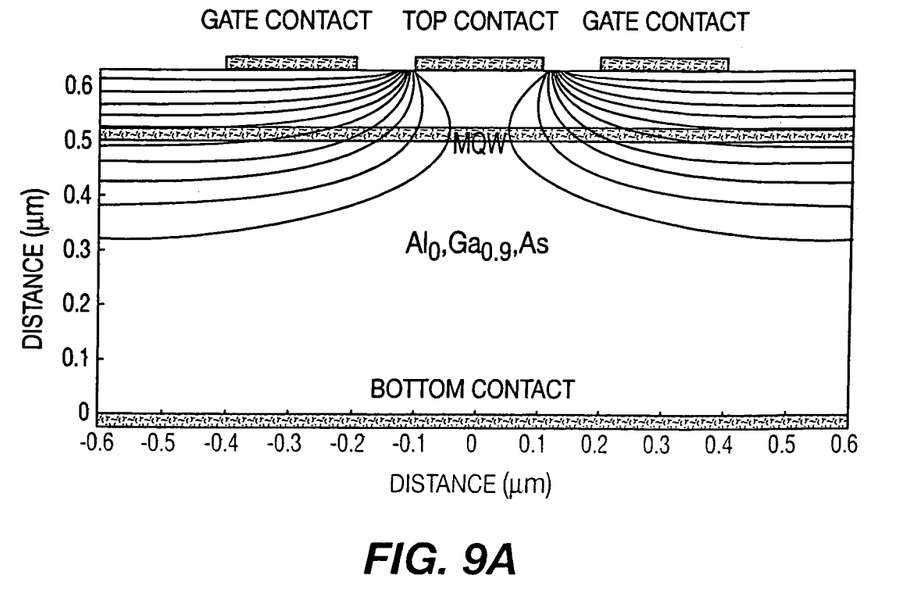
FIG. 9 includes graphical diagrams illustrating aspects of the present invention.
Figure 9B:
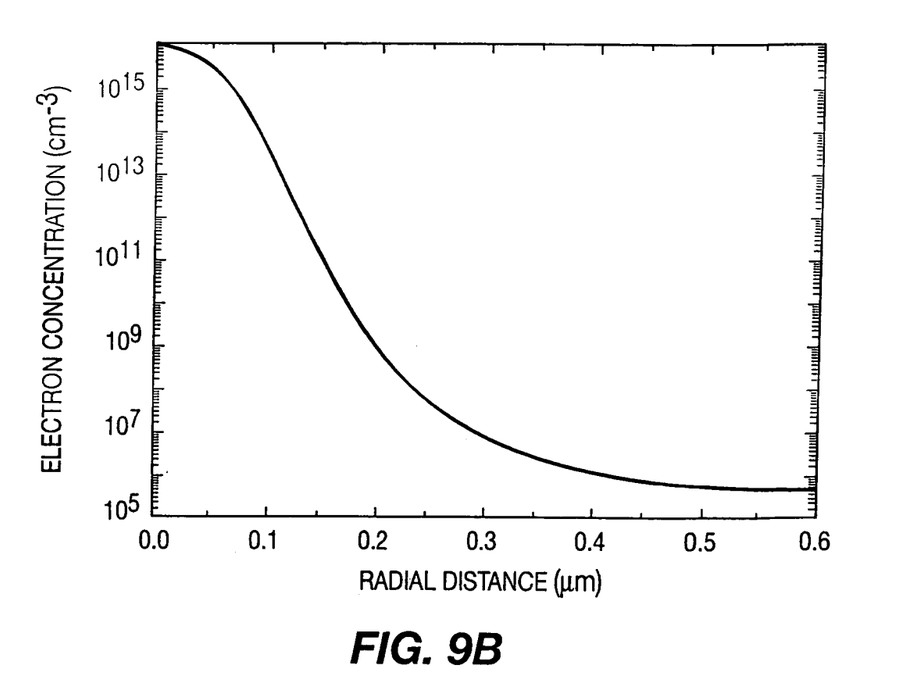

FIG. 9 shows graphical diagrams illustrating aspects of the present invention. FIG. 9A is a simulation output graph showing the simulated device geometry and calculated iso-potential lines of the present invention. The simulated device includes, in the illustrated exemplary embodiment, a thin multi-quantum well (MQW) active layer sandwiched between two $Al_{0.1}Ga_{0.9}As$ n-doped layers ($n=10^{16}$ $cm^{-3}$). The wells may be delta-doped to $n=10^{18}$ $cm^{-3}$. FIG. 9B illustrates a simulation of the rapid lateral depletion of carriers for a small gate voltage of −0.8 volts.

Figure 10:
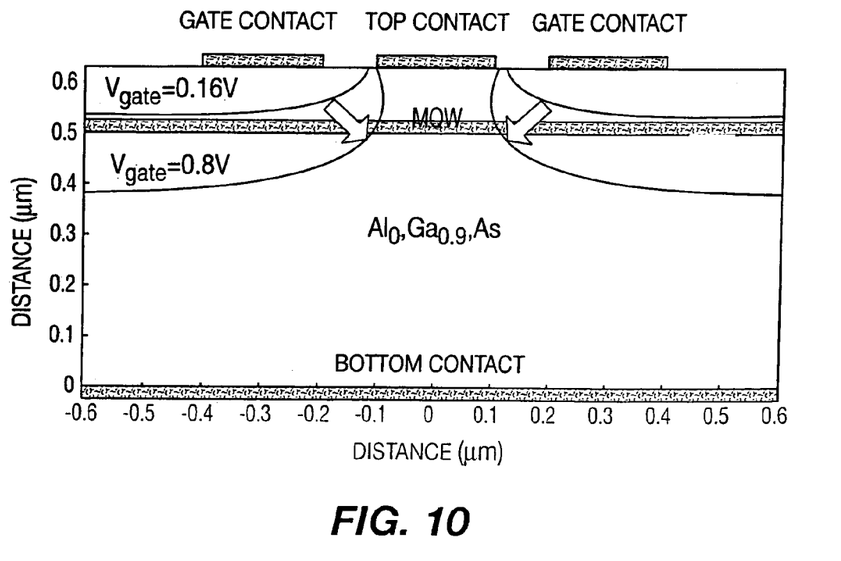
FIG. 10 is a schematic diagram illustrating the iso-potential line of −0.14 volts for two different gate voltages, namely −0.8 and +0.16 volts.

As expected, the simulation shows that the iso-potential lines move towards the center of the device as the gate voltage becomes increasingly negative (deeper depletion). FIG. 10 is a schematic diagram illustrating the iso-potential line of −0.14 volts for two different gate voltages, namely −0.8 and +0.16 volts.

The potential well induced by this gate voltage inside the quantum wells exhibits a parabolic shape near the center of the device, as expected.

Figure 11:
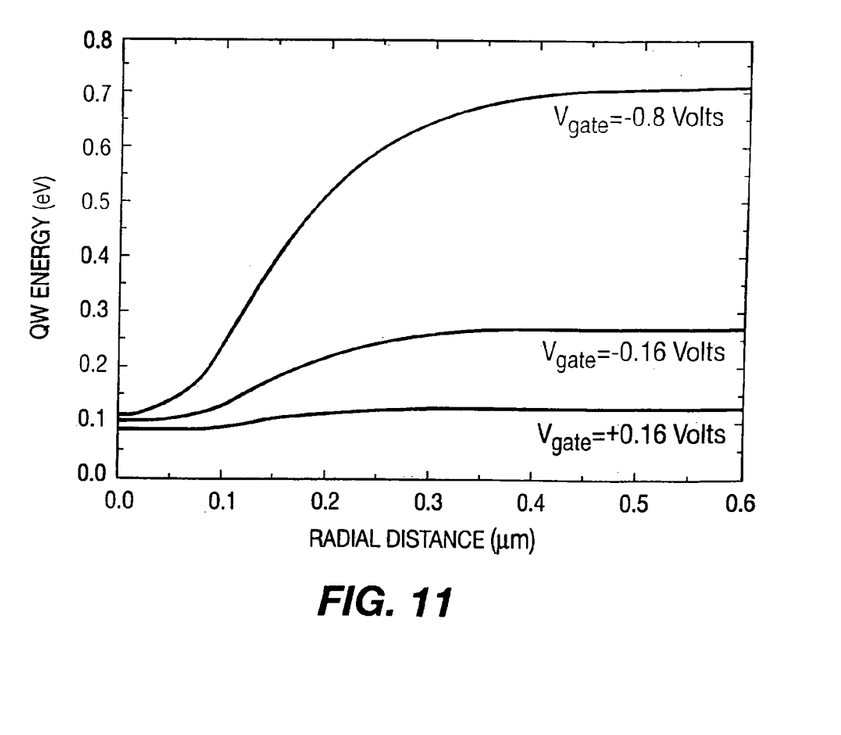
FIG. 11 is a graphical diagram illustrating aspects of the present invention.

Such a well shape is expected based on the space-charge principles illustrated in FIG. 11. The confining energy, which corresponds to the quantum dot radial "barrier" potential, is a sensitive function of the gate voltage. For example, the barrier height changes by ~0.68 eV for a 0.96 volt change of gate voltage. Based upon knowledge of the radial potential well induced in the quantum well by the gate voltage, it is possible to find the electronic states and wavefunctions inside the quantum dot.

Figure 12:
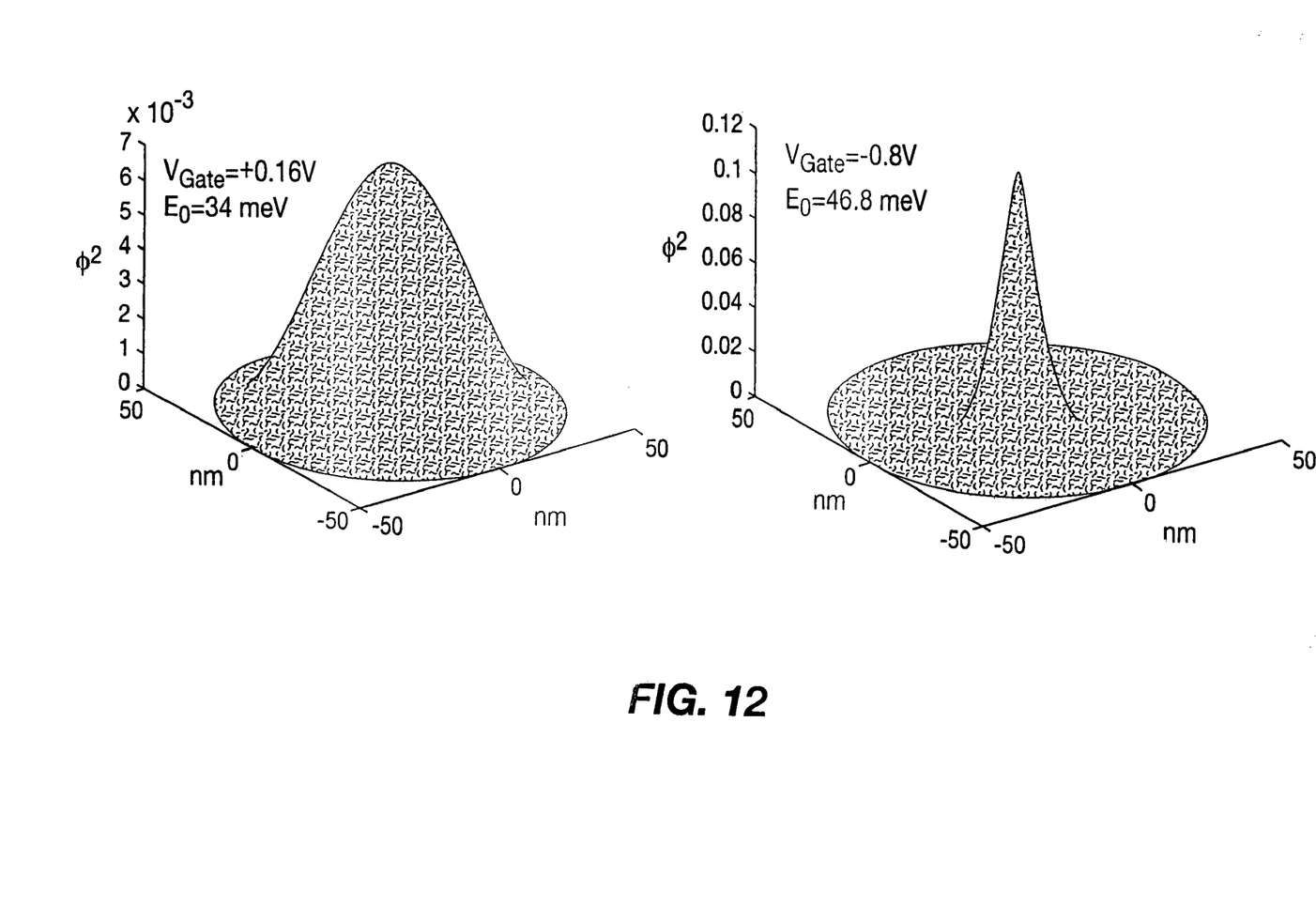
FIG. 12 is a graphical diagram illustrating the electron wavefunctions, in the lowest energy level state, for two different gate voltages in a device with a 0.1 μm gate opening.

Accordingly, a finite-element-method approach may be adopted to determine the TQD energy states. The Schrodinger Equation may be solved using the potential wells, taking advantage of the cylindrically symmetric geometry, to find the electron wavefunction and energy levels within the quantum dot. FIG. 12 is a graphical diagram illustrating the electron wavefunctions, in the lowest energy level state, for two different gate voltages in a device with a 0.1 μm gate opening. The induced lateral confinement, resulting from a gate voltage of −0.8 volts, squeezes the electron wavefunction into a small disk with a radius of about 7 nm.

Figure 13:
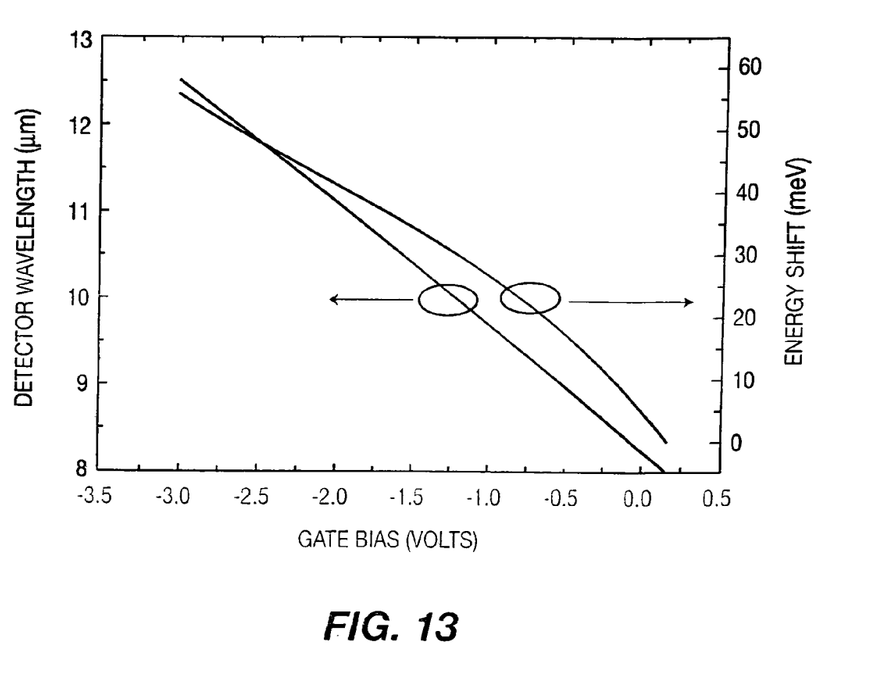
FIG. 13 is a graphical diagram illustrating aspects of the present invention.

A direct result of this confinement is the energy shift of the states. The energy shift, and hence the wavelength shift of the detector, may be calculated as a function of the gate voltage, as illustrated in the graph of FIG. 13. As illustrated, substantial energy shift can be achieved from a small gate voltage change, and the detector can cover the 8–12 μm wavelength range with a gate voltage swing of about 3 volts. While not limiting of the present invention, the wavelength shift appears to be a quasi-linear function of the gate voltage, although the energy shift is not.

According to an aspect of the present invention, due to improved uniformity of quantum dots effected, greater uniformity of operational characteristics across formed quantum dots may be realized than may otherwise be achievable using self assembly techniques, for example. By way of non-limiting example only, operational ranges of a few nanometers may be achievable in the telecommunications spectrum range.

In other words, the degree of size uniformity that one can realize over a large area using the present method is mainly limited by the mask uniformity, or uniformity of nano-spheres used for example. Improvement in the size uniformity of these nano-spheres means that one can make very uniform quantum dots with the proposed method. Using these quantum dots for quantum cascade lasers, one can realize lasers with extremely narrow gain spectrum, which implies ultra low threshold useful for telecommunication applications. Similarly, one can construct modulators with extremely low operating voltage and hence power consumption.

Similarly, one can make quantum cascade lasers in the mid and long wavelength infrared ranges. Both may be tunable, and can operate at and above room temperature. Advantageously, such lasers can be used for extremely lightweight and low power laser chemical sensing systems.

Further, one may form the mask nano-structures or nano-spheres in particular shapes to form artificial molecules from coupled artificial atoms (or quantum dots). Since these artificial molecules are adjustable, one can perform quantum computing with them. Useful shapes such as a string of nano-spheres can be formed using magnetic nano-particles.

Those of ordinary skill in the art will recognize that many modifications and variations of the present invention may be implemented. The foregoing description and the following claims are intended to cover all such modifications and variations.

What is claimed is:

1. A tunable quantum dot based structure, comprising: multi-quantum wells sandwiched substantially between at least two structural layers; and, gate, top and bottom electrical contacts to said structural layers; wherein, application of a voltage to said contacts induces an electrical field with respect to said multi-quantum wells so as to effect at least one quantum dot.

2. The tunable structure of claim 1, wherein the gate contact comprises a Schottky contact.

3. The tunable structure of claim 2, wherein at least the top and back contacts comprise ohmic contacts.

4. The tunable structure of claim 1, wherein, as voltage on the gate contact becomes more negative, a lateral electrostatic potential inside each of said multi-quantum wells increases.

5. The tunable structure of claim 4, wherein the increased lateral electrostatic potential forces an accumulation of an electron wave-function under the top contact.

6. The tunable structure of claim 5, wherein the accumulation decreases an effective diameter of the at least one quantum dot.

7. The tunable structure of claim 6, wherein the accumulation increases an electron energy level.

8. The tunable structure of claim 1, wherein an electron energy shift is a function of voltage on the gate contact.

9. The tunable structure of claim 1, further comprising a plurality of gate, top and bottom contacts, wherein the top contacts are surrounded by the gate contacts.

10. The tunable structure of claim 9, wherein the gate contacts comprise dimensions of approximately 0.1 µm.

11. A method of using a tunable quantum dot apparatus comprising multi-quantum wells sandwiched substantially between at least two structural layers; and, gate, top and bottom electrical contacts to said structural layers; wherein, application of a voltage to said contacts induces an electrical field with respect to said multi-quantum wells so as to effect at least one quantum dot, said method comprising: applying a voltage across the contacts, thereby preventing formation of energy bands in the multi-quantum wells by inducing at least one lateral electric field to the multi-quantum wells to change a density of electron states in the multi-quantum wells from a step-shape to a series of delta functions.

12. The method of claim 11, further comprising limiting a linewidth of the tunable quantum dot apparatus due to lateral inhomogeneous broadening to approximately $\Delta\lambda \sim 0.4$ µm.

13. The method of claim 11, wherein the applying the voltage comprises increasing negativity of a voltage on the gate contact.

14. The method of claim 13, wherein said increasing negativity decreases an effective diameter of said quantum dot.

* * * * *